US009451708B2

(12) United States Patent
Ito et al.

(10) Patent No.: US 9,451,708 B2
(45) Date of Patent: Sep. 20, 2016

(54) VACUUM THERMAL BONDING APPARATUS

(75) Inventors: Takashi Ito, Kamiina-gun (JP); Hiroki Sato, Kamiina-gun (JP)

(73) Assignee: MIKADO TECHNOS CO., LTD., Kamina (JP)

( * ) Notice: Subject to any disclaimer, the term of this patent is extended or adjusted under 35 U.S.C. 154(b) by 240 days.

(21) Appl. No.: 14/112,330

(22) PCT Filed: Aug. 20, 2012

(86) PCT No.: PCT/JP2012/005198
§ 371 (c)(1),
(2), (4) Date: Oct. 17, 2013

(87) PCT Pub. No.: WO2013/035251
PCT Pub. Date: Mar. 14, 2013

(65) Prior Publication Data
US 2014/0033518 A1 Feb. 6, 2014

(30) Foreign Application Priority Data
Sep. 5, 2011 (JP) ................. 2011-192995

(51) Int. Cl.
H05K 3/00 (2006.01)
H05K 3/30 (2006.01)
(Continued)

(52) U.S. Cl.
CPC ........... H05K 3/305 (2013.01); B30B 5/02 (2013.01); B30B 11/027 (2013.01); B30B 15/34 (2013.01);
(Continued)

(58) Field of Classification Search
CPC ....... H01L 21/00; H01L 35/00; H01L 35/34; H01L 24/75; H01L 24/32; H01L 24/83; H01L 2224/2929; H01L 2224/293; H01L 2224/32225; H01L 2224/75102; H01L 2224/75315; H01L 2224/75316; H01L 2224/75317; H01L 2224/83001; H01L 2224/8309; H01L 2224/83191; H01L 2224/83203; H01L 2224/83209; H01L 2924/00; H01L 2924/00014; B30B 5/02; B30B 11/027; B30B 15/34; B30B 37/1009; B30B 37/1284; B32B 2457/12; B32B 2457/14; H05K 3/305; Y02P 70/613; Y10T 29/53174; Y10T 29/53191
See application file for complete search history.

(56) References Cited

U.S. PATENT DOCUMENTS 5,176,078 A * 1/1993 Homma .................. B41F 15/12
101/126
5,452,656 A * 9/1995 Becher ................ H05K 3/1216
101/126

(Continued)

FOREIGN PATENT DOCUMENTS

JP B1-4176817 11/2008
JP A-2011-63685 3/2011
WO 2010090223 A1 * 8/2010

OTHER PUBLICATIONS

International Search Report issued in International Patent Application No. PCT/JP2012/005198 dated Sep. 25, 2012.
(Continued)

Primary Examiner — Carl Arbes
(74) Attorney, Agent, or Firm — Oliff PLC

(57) ABSTRACT

A vacuum thermally bonding apparatus is provided, in which while air is being prevented in vacuum from entering a bonding layer, an element is thermally bonded to a substrate under vacuum by forming the bonding layer having a good thickness under an appropriate pressing pressure, while suppressing runout of the adhesive as much as possible, with a pressing force being slightly adjustable. A lower end portion of an upper frame member is gas-tightly slidably sealed to a peripheral portion of the lower plate member to form a vacuum partition wall therein, and a pressurizing release film is contacted with an upper face of the element, and thermally softened in the atmospheric pressure. A vacuum chamber is evacuated to vacuum, and the lower plate member and an intermediate member are relatively moved in an approaching direction, so that an outer peripheral portion of the pressurizing release film is gas-tightly held between the upper face of the substrate-placing table of the lower plate member and a lower face of an inner frame body. By applying the atmospheric pressure or a pressure higher than the atmospheric pressure to a space above the pressurizing release film inside the vacuum chamber, the pressurizing release film is adhered onto the outer surfaces of the substrate and the element, and the element is bonded to the substrate.

18 Claims, 9 Drawing Sheets

(51) Int. Cl.
*B30B 15/34* (2006.01)
*H01L 23/00* (2006.01)
*B30B 5/02* (2006.01)
*B32B 37/10* (2006.01)
*B30B 11/02* (2006.01)
*B32B 37/12* (2006.01)

(52) U.S. Cl.
CPC ........... *B32B 37/1009* (2013.01); *H01L 24/75* (2013.01); *B32B 37/1284* (2013.01); *B32B 2457/12* (2013.01); *B32B 2457/14* (2013.01); *H01L 24/32* (2013.01); *H01L 24/83* (2013.01); *H01L 2224/293* (2013.01); *H01L 2224/2929* (2013.01); *H01L 2224/32225* (2013.01); *H01L 2224/75102* (2013.01); *H01L 2224/75315* (2013.01); *H01L 2224/75316* (2013.01); *H01L 2224/75317* (2013.01); *H01L 2224/83001* (2013.01); *H01L 2224/8309* (2013.01); *H01L 2224/83191* (2013.01); *H01L 2224/83203* (2013.01); *H01L 2224/83209* (2013.01); *H01L 2924/07802* (2013.01); *Y02P 70/613* (2015.11); *Y10T 29/53174* (2015.01); *Y10T 29/53191* (2015.01)

(56) References Cited

U.S. PATENT DOCUMENTS

| | | | | |
|---|---|---|---|---|
| 5,730,051 | A * | 3/1998 | Takahashi | B41F 15/10 101/126 |
| 6,036,994 | A * | 3/2000 | Tanaka | B41F 15/0818 101/126 |
| 6,131,511 | A * | 10/2000 | Wachi | B41F 15/10 101/126 |
| 6,237,490 | B1 * | 5/2001 | Takahashi | B41F 15/0818 101/123 |
| 7,631,597 | B2 * | 12/2009 | Dumenil | B41F 15/0818 101/123 |
| 8,776,685 | B2 * | 7/2014 | Nagao | B41F 15/08 101/123 |
| 2004/0033128 | A1 * | 2/2004 | Kabeshita | H05K 13/0061 29/740 |
| 2009/0151576 | A1 | 6/2009 | Ito | |

OTHER PUBLICATIONS

Partial Written Opinion issued in International Patent Application No. PCT/JP2012/005198 dated Sep. 25, 2012 (with translation).

\* cited by examiner

Fig. 3(b)]

VACUUM THERMAL BONDING APPARATUS

TECHNICAL FIELD

The present invention relates to a vacuum thermal bonding apparatus and a vacuum thermal bonding method for bonding an element such as a semiconductor, a resistance and/or a condenser to a substrate, bonding this substrate to a heat-dissipating plate, and imprint transferring or bonding a film sheet such as an ITO film.

BACKGROUND ART

When an element such as a semiconductor, a resistance and/or a condenser to a substrate is to be bonded or sealed to a substrate, they are bonded together with use of an insulating adhesive or an electroconductive adhesive between the substrate and the element. When the adhesive layer is press worked, the adhesive runs over so that a bonding capacity of the insulating layer or the electroconductive layer formed decreases to deteriorate the performance.

The present applicant proposed an apparatus for hot pressing a thin plate-like workpiece to be used in covering, with a protective sheet made of a thermosetting adhesive, a package substrate in which a thin element such as a semiconductor, a condenser or a resistance is fixed to a predetermined position of a thin plate-like substrate.
See Patent Document 1.

The present inventors examined whether a bonding agent could be prevented from running over in case of bonding or sealing the element onto the substrate by using a hot pressing apparatus shown in FIG. 6(a) with an adhesive. As shown in FIG. 6(b), a bottom face of a lower end of an upper frame member is brought into contact with an upper face of an upper end of a lower frame member by using this apparatus, a lower face of a heat-resistant stretchable film member is brought into contact with upper faces of a substrate on a lower mold member and an element thereon, a workpiece is preliminarily heated with an upper heater plate and a lower heater plate, while the heat-resistant stretchable film member is substantially horizontally held in the state that the film member is prevented from hanging down; the element is sealed onto the substrate with the heat-resistant stretchable film member by pressurizing a heat medium inside a heat medium-filled space, while the heat-resistant stretchable film member is being prevented from stretching outwardly in radial directions. However, contrary to the expectation, it was difficult to well bond or seal the element onto the substrate, while the runout of the adhesive was minimized. In addition, when the element is sealingly bonded to the substrate having the element preliminarily fixedly bonded thereto by using the sealing sheet, it was difficult to make the sealing and the bonding in a uniform thickness, so that a sealed corner was broken or poor sealing occurs.

PRIOR ART LITERATURE

Patent Document

Patent Document 1: Japanese Patent No. 4,176,817

SUMMARY OF THE INVENTION

Problems to be Solved by the Invention

The present invention is aimed at providing a vacuum thermally bonding apparatus and method, which enable a pressing force to be finely adjusted, while air is being prevented from entering a bonding layer under vacuum, and can bond or seal an element onto a substrate with a good thickness of a bonding layer, while minimizing runout an adhesive under appropriate pressing. In addition, when a substrate and an element are to be sealingly bonded with a sealing sheet, the element can be sealingly bonded onto the substrate with a uniformed thickness of a sealing layer under appropriate pressing, while air is prevented from being mixed into the sealing layer (bonding layer) under vacuum and the pressing force is finely adjustable.

Countermeasures to Solve the Problems (1) In order to solve the above problems, the present invention is to provide a vacuum thermally bonding apparatus for thermally bonding an element onto a substrate under vacuum, said vacuum thermally bonding apparatus comprising:
(a) a base,
(b) a press cylinder lower plate arranged on the base,
(c) a lower heater plate adiabatically arranged above the press cylinder lower plate,
(d) a lower plate member arranged on an upper face of the lower heater plate, a substrate-placing member arranged on the lower plate member,
(e) supporting posts erected on the base,
(f) a press cylinder upper plate fixed to upper portions of the supporting posts,
(g) an intermediate member arranged under the press cylinder upper plate,
(h) an upper heater plate arranged adiabatically under the intermediate member,
(i) an upper frame member arranged gas-tightly on a lower face of the upper heater plate, a lower end of the upper frame member being gas-tightly sealable on a peripheral portion of the lower plate member,
(j) an inner frame body attached to a lower face of the upper heater plate within the upper frame member, an lower end face of the inner frame body being positioned above an upper face of the lower plate member, and the lower end face of the inner frame body being brought into gas-tight contact with an upper face of the substrate-placing table when the inner frame body and the substrate-placing table are approached and brought into contact with each other,
(k) a driving unit adapted to relatively move the lower plate member and the intermediate member in an approaching direction, to form a vacuum partition wall defining a vacuum chamber by gas-tightly and slidably sealing the lower end of the upper frame member to the peripheral portion of the lower plate member, to bring the lower end face of the inner frame body into gas-tight contact with the upper face of the substrate-placing table by further relatively moving the lower plate member and the intermediate member in the approaching direction, and to relatively move the lower plate member and the intermediate member in a separating direction, and
(l) a vacuuming/pressurizing opening for deaerating to vacuum or pressurizing the vacuum chamber inside the vacuum partition wall to vacuum,
(m) wherein the vacuum chamber is opened by relatively moving the lower plate member and the intermediate member in the separating direction with the driving unit,
(n) the substrate is placed on an upper face of the substrate-placing table, the element is placed on an upper face of the substrate via an adhesive; a pressurizing release film is placed on or above an upper face of the element, while being extended above and outside the substrate and an outer peripheral portion of the pressurizing release film and a lower face of the inner frame body are opposed to each other outside the substrate;

(o) by relatively moving the lower plate member and the intermediate member in the approaching direction with the driving unit, the lower end of the upper frame member is gas-tightly slidably sealed to the peripheral portion of the lower plate member and the vacuum partition wall to define the vacuum chamber therein is formed, (p) the pressurizing release film is contacted with the upper face of the element, and softened under heating in the atmospheric pressure, (q) the vacuum chamber is evacuated to vacuum via the vacuuming/pressurizing opening, (r) the outer peripheral portion of the pressurizing release film is gas-tightly held between the upper face of the substrate-placing table and the lower face of the inner frame body by further relatively moving the lower plate member and the intermediate member in the approaching direction by means of the driving unit; and (s) by applying the atmospheric pressure or a pressure higher than the atmospheric pressure to a space above the pressurizing release film inside the vacuum chamber in this state via the vacuuming/pressurizing opening, the pressurizing release film is adhered to the outer surfaces of the substrate and the element, and the element is bonded to the substrate.

(2) In order to solve the above problems, the present invention is to provide a vacuum thermally bonding apparatus for thermally sealing and bonding an element onto a substrate under vacuum, said vacuum thermally bonding apparatus comprising:

(a) a base, (b) a press cylinder lower plate arranged on the base, (c) a lower heater plate arranged adiabatically above the press cylinder lower plate, (d) a lower plate member arranged on an upper face of the lower heater plate, a substrate-placing member arranged on the lower plate member, (e) supporting posts erected on the base, (f) a press cylinder upper plate fixed to upper portions of the supporting posts, (g) an intermediate member arranged under the press cylinder upper plate, (h) an upper heater plate arranged adiabatically under the intermediate member, (i) an upper frame member arranged gas-tightly on a lower face of the upper heater plate, a lower end of the upper frame member being gas-tightly sealable on a peripheral portion of the lower plate member, (j) an inner frame body attached to a lower face of the upper heater plate within the upper frame member, a lower end face of the inner frame body being positioned above an upper face of the lower plate member, and the lower end face of the inner frame body being brought into gas-tight contact with an upper face of the substrate-placing table when the inner frame body and the substrate-placing table are approached to and brought into contact with each other, (k) a driving unit adapted to relatively move the lower plate member and the intermediate member in an approaching direction, to form a vacuum partition wall defining a vacuum chamber by gas-tightly and slidably sealing the lower end of the upper frame member to the peripheral portion of the lower plate member, to gas-tightly bring the lower end face of the inner frame body into contact with the upper face of the substrate-placing table by further relatively moving the lower plate member and the intermediate member in the approaching direction, and to relatively move the lower plate member and the intermediate member in a separating direction, and (l) a vacuuming/pressurizing opening for deaerating to vacuum or pressurizing the vacuum chamber inside the vacuum partition wall, (m) wherein the vacuum chamber is opened by relatively moving the lower plate member and the intermediate member in the separating direction with the driving unit, (n) an element-provided substrate in which an element is preliminarily bonded and fixed onto a substrate via an adhesive is placed on an upper face of the substrate-placing table; a sealing sheet to seal the element-provided substrate is placed on an upper face of the element and between the element and the pressurizing release film, while being extended up to outside the element; the pressurizing release film is placed on or above an upper face of the sealing sheet, while being extended above and up to outside the substrate and an outer peripheral portion of the pressurizing release film and a lower face of the inner frame body are opposed to each other outside the substrate;

(o) by relatively moving the lower plate member and the intermediate member in the approaching direction with the driving unit, the lower end of the upper frame member is gas-tightly slidably sealed to the peripheral portion of the lower plate member and the vacuum partition wall to define the vacuum chamber therein is formed, (p) the pressurizing release film is contacted with the upper face of the sealing sheet on the upper face of the element, and softened under heating in the atmospheric pressure, (q) the vacuum chamber is evacuated to vacuum via the vacuuming/pressurizing opening, (r) the outer peripheral portion of the pressurizing release film is held gas-tightly between the upper face of the substrate-placing table and the lower face of the inner frame body by further relatively moving the lower plate member and the intermediate member in the approaching direction with the driving unit; and (s) by applying the atmospheric pressure or a pressure higher than the atmospheric pressure to a space above the pressurizing release film inside the vacuum chamber via the vacuuming/pressurizing opening in this state, the pressurizing release film and the sealing sheet are adhered tightly to the substrate and the element, and the element is bonded to the substrate.

In the following, preferred embodiments of the present invention will be recited.

(3) The vacuum thermally bonding apparatus set forth in (1) or (2), wherein a plurality of elements are placed on the upper face of the substrate. In this case, the plural elements may be of the same kind or of different kinds.

(4) The vacuum thermally bonding apparatus set forth in (1), (2) or (3), wherein the pressurizing release film is arranged on the upper face of the element or on the sealing sheet on the upper face of the element, while being positioned above the substrate and extended outwardly from the sealing sheet, and the outer periphery of the pressurizing release film is opposed to the lower face of the inner frame body.

(5) The vacuum thermally bonding apparatus set forth in (1), (2) or (3), wherein the pressurizing release film is detachably fixed to the lower end face of the inner frame member.

(6) The vacuum thermally bonding apparatus set forth in (1), (2) or (3), wherein a pressurizing release film-holding jig is arranged around the substrate and on an upper face of the substrate-placing table the outer periphery of the pressurizing release film is detachably fixed to the pressurizing release film-holding jig; the pressurizing release film-holding jig is arranged around the substrate, while a slight ventilatable gap is provided on the upper face of the lower plate member via a spring, the pressurizing release film is arranged on or above the upper face of the element on the substrate, or on or above the sealing sheet on the upper face of the element; by relatively moving the lower plate member and the intermediate member with the driving unit in the approaching direction, the lower end portion of the upper frame member is gas-tightly slidably sealed to the peripheral portion of the lower plate member, thereby forming the vacuum partition wall to define the vacuum chamber; after the pressurizing release film is softened under heating in the atmosphere, the vacuum chamber is evacuated to vacuum through the vacuuming/pressurizing opening; by further relatively moving the lower plate member and the intermediate member with the driving unit in the approaching direction, the pressurizing release film-holding jig is slidably brought into gas-tight contact with the upper face of the lower plate member, thereby holding a space between the pressurizing release film and the upper face of the lower plate member in vacuum; and in this state the atmospheric pressure or a pressure higher than the atmospheric pressure is applied into a space above the pressurizing release film within the vacuum partition wall through the vacuuming/pressurizing opening, thereby the pressurizing release film is adhered onto the outer surfaces of the substrate and the element.

(7) The vacuum thermally bonding apparatus set forth in any of (1) to (6), wherein the intermediate plate is slidable relative to the supporting posts under the press cylinder upper plate, the upper heater plate is adiabatically fixed to the lower face of the intermediate plate, a moving cylinder is provided above the press cylinder upper plate as the driving unit, and the lower end of a cylinder rod of the moving cylinder is fixed to the intermediate plate through the press cylinder upper plate.

(8) The vacuum thermally bonding apparatus set forth in any of (1), (2), (3), (4) and (7), wherein a slide table is laterally movably arranged on the upper face of the base, the lower heater plate is arranged adiabatically on the slide table, a slide table-moving device is provided to move the slide table; in a state that the upper frame member is moved upwardly, the slide table, the lower heater plate and the lower plate member are taken outside by the slide table-moving device, whereas the slide table, the lower heater plate and the lower plate member are movable under the upper frame member within the vacuum thermally bonding apparatus by the slide table-moving device; the substrate is placed on the substrate-placing table, the element is placed on the substrate, and the pressurizing release film is placed on the element, or alternatively, the element-provided substrate is placed on the substrate-placing table, the sealing sheet is placed on the element of the element-provided substrate, and the pressurizing release film is placed on the sealing sheet; the slide table, the lower heater plate and the lower plate member are moved under the upper frame member inside the vacuum thermally bonding apparatus by the slide table-moving device; and the substrate and the element having undergone a bonding treatment and the pressurizing release film, or the element-provided substrate having undergone a sealing and bonding treatment with the sealing sheet and the pressurizing release film can be taken outside.

(9) The vacuum thermally bonding apparatus set forth in any of (5), wherein a slide table is laterally movably arranged on the upper face of the base, the lower heater plate is arranged adiabatically on the slide table, the slide table-moving device is provided to move the slide table; in a state that the upper frame member is moved upwardly, the slide table, the lower heater plate and the lower plate member can be taken out by the slide table-moving device; the slide table, the lower heater plate and the lower plate member can be moved to under the upper frame member inside the vacuum thermally bonding apparatus by the slide table-moving device; the substrate is place on the substrate-placing table, and the element is placed on the substrate, or the element-provided substrate is placed on the substrate-plating table and the sealing sheet is placed on the element of the element-provided substrate, the slide table-moving device enables the slide table, the lower heater plate and the lower plate member to move to under the upper frame member within the vacuum thermally bonding apparatus and to take out the substrate and the element having undergone a bonding treatment or the element-provided substrate having undergone a sealing and bonding treatment with the sealing sheet.

(10) The vacuum thermally bonding apparatus set forth in (6), wherein the slide table is laterally movably arranged on the upper face of the base, the lower heater plate is arranged adiabatically on the slide table, a slide table-moving device is provided to move the slide table; in a state that the upper frame member is moved upwardly, the slide table, the lower heater plate and the lower plate member can be taken outside by the slide table-moving device, whereas the slide table, the lower heater plate and the lower plate member can be moved to under the upper frame member inside the vacuum thermally bonding apparatus by the slide table-moving device; the substrate is placed on the substrate-placing table, and the element is placed on the substrate, or the element-provided substrate is placed on the substrate-placing table, and the sealing sheet is placed on the element of the element-provided substrate, the pressurizing release film-holding jig is arranged on the upper face of the substrate-placing table and around the substrate; by using the slide table-moving device, the slide table, the lower heater plate and the lower plate member can be moved to under the upper frame member within the vacuum thermally bonding apparatus and the substrate and the element having undergone a bonding treatment or the element-provided substrate having undergone a sealing/bonding treatment with the sealing sheet can be taken out.

(11) In addition, the present invention relates to a vacuum thermally bonding method for bonding an element on a substrate under heating, said vacuum thermally bonding method comprising: while a vacuum partition wall to define a vacuum chamber is opened, inside the vacuum partition wall, placing the substrate on a substrate-placing table, and placing the element on the substrate; placing a pressurizing release film on or above an upper face of the element, while being extended above the substrate and outwardly thereon; forming the vacuum chamber by closing the vacuum partition wall, confining the substrate, the element and the pressurizing release film therein; in a state that the pressurizing release film is brought into contact with the upper face of the element, softening the pressurizing release film in the atmospheric pressure under heating, evacuating spaces above and under the pressuring release film inside the vacuum chamber to vacuum; after an outer peripheral portion of the pressurizing release film is gas-tightly and fixedly adhered onto the substrate-placing table outside the substrate, subjecting the space above the pressurizing release film inside the vacuum chamber to the atmospheric pressure or a pressure higher than the atmospheric pressure; bonding and the substrate and the element together by adhering the pressurizing release film onto outer surfaces of the substrate and the element.

(12) Furthermore, the present invention relates to a vacuum thermally bonding method for thermally and sealingly bonding an element-provided substrate with a sealing sheet, said vacuum thermally bonding method comprising: while a vacuum partition wall to define a vacuum chamber is opened, inside the vacuum partition wall, an element-provided substrate is placed on a substrate-placing table, a sealing sheet to seal the element-provided substrate is placed on an upper face of the element of the element-provided substrate, while extended outward from the element; a pressurizing release film is placed on or above the sealing sheet, while being extended above the substrate and outside of the sealing sheet: the vacuum chamber is formed by closing the vacuum partition wall, the element-provided substrate and the pressurizing release film are confined therein; while the pressurizing release film is being contacted with the upper face of the element, the pressurizing release film is softened in the atmospheric pressure under heating, spaces above and under the pressurizing release film inside the vacuum chamber are evacuated to vacuum; after an outer peripheral portion of the pressurizing release film is gas-tightly and fixedly adhered onto the substrate-placing table outside of the substrate, the space above the pressurizing release film inside the vacuum chamber is subjected to the atmospheric pressure or a pressure higher than the atmospheric pressure, the pressurizing release film is adhered onto outer surfaces of the substrate and the element, and the substrate and the element are bonded together.

Effects of the Invention

The following effects are obtained according to the vacuum thermally bonding apparatus and method of the present invention.

(1) When the substrate and the element are to be bonded together without using the sealing sheet, the pressurizing release film is softened in the atmospheric pressure under heating; after evacuating, an outer surface of the pressurizing release film is pressurized with the atmosphere or a gas having a pressure higher than the atmospheric pressure, thereby the pressurizing film is adhered onto the substrate and the element, and the substrate and the element can be thermally bonded under vacuum with a desired and uniform bonding layer free from bubbles.

(2) When the element-provided substrate is to be sealed and bonded with the sealing sheet, bubbles between the outer surface of the element-provided substrate and the sealing sheet are removed, the sealing sheet and the pressurizing release film are softened under heating in the atmospheric pressure; after the evacuation, the outer surface of the pressurizing release film is pressurized with the atmosphere or the gas having the pressure higher than the atmospheric pressure, so that the sealing sheet and the pressurizing release film can be adhered to the element-provided substrate, and the element-provided substrate can be sealed and bonded together with the desired uniform sealing layer free from bubbles by heating under vacuum.

(3) Since the pressurizing can be finely adjusted by controlling the pressure of the gas, the bonding layer having an appropriately uniform thickness can be formed between the substrate and the element, and a desired bonding capacity can be ensured thereby.

(4) Since the properties of the thermally softenable pressurizing release film or the pressurizing release film and the sealing sheet are utilized, a thermally softening hydraulic mechanism and a hydraulic circuit in a complicated fashion are made unnecessary, so that the construction of the vacuum thermally bonding apparatus can be simplified.

BRIEF DESCRIPTION OF THE DRAWINGS

FIG. 3(b) is a schematic view of a principal portion for showing a vacuum partition wall-forming step to thermally bond the element of the element-provided substrate to the substrate with the pressurizing release film and the sealing sheet under vacuum by using the vacuum thermally bonding apparatus according to the second embodiment of the present invention.

EXPLANATION OF REFERENCE NUMERALS

1—base, 2—press cylinder lower plate, 3—press cylinder upper plate, 4—slide cylinder, 5—lower heater plate, 6—lower plate member, 7—substrate-placing table, 8—support pole, 9—press cylinder upper plate 10—intermediate member (intermediate moving member), 11—upper heater plate, 12—upper frame member, 13—inner frame body, 14—press cylinder, 15—cylinder rod, 16—vacuuming/pressurizing opening, 18—inner frame body, 19—inner frame body, 20—pressurizing release film jig

EMBODIMENTS FOR CARRYING OUT THE INVENTION

First Embodiment

Figure 1:
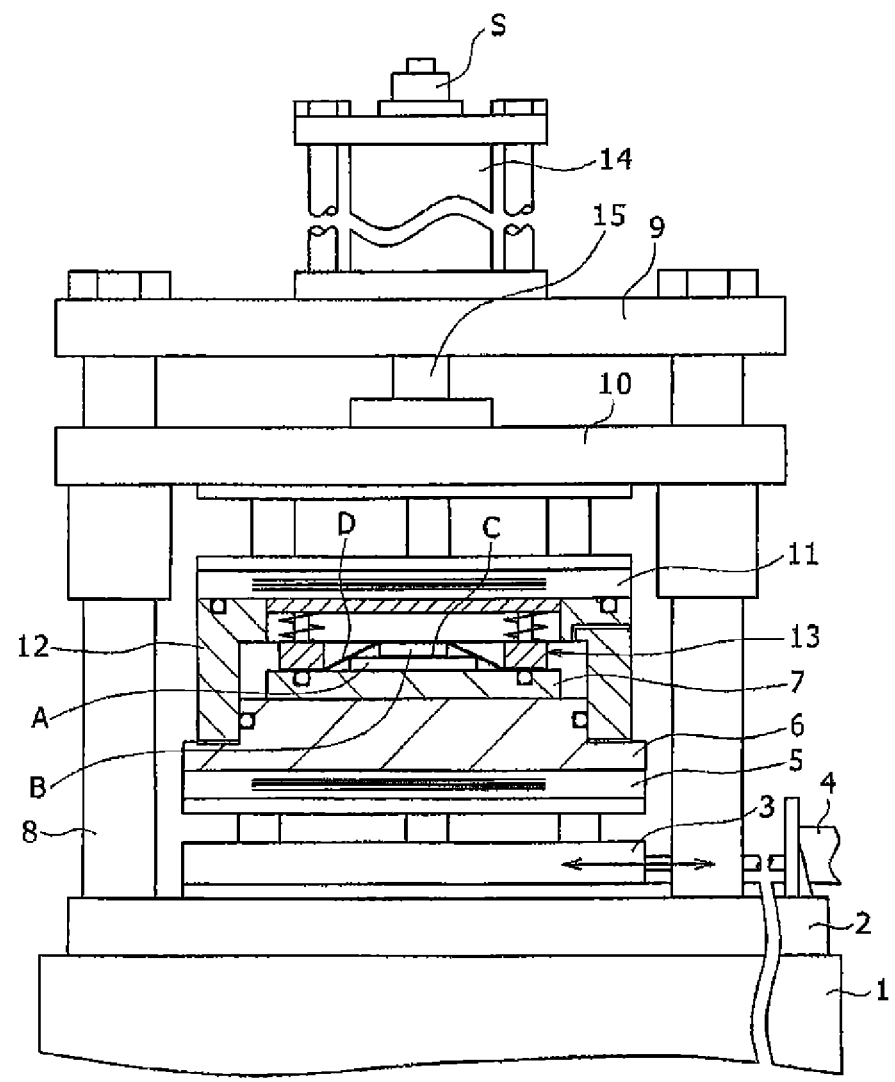
FIG. 1 shows a schematic view of a vacuum thermally bonding apparatus according to a first embodiment of the present invention.

FIG. 1 shows a vacuum thermally bonding apparatus according to a first embodiment of the present invention. In this vacuum thermally bonding apparatus, a press cylinder lower plate 2 is arranged on a base 1, a slidably moving table 3 is arranged on the press cylinder lower plate 2 such that the moving table can be moved between the inside and the outside of the vacuum thermally bonding apparatus by a slide cylinder 4. A lower heater plate 5 is arranged adiabatically above the slidably moving table 3, a lower plate member 6 is placed on an upper face of the lower heater plate 5, and a substrate-placing table 7 is placed on an upper face of the lower plate member.

A plurality of support poles 8 are arranged on and erected from the press cylinder lower plate 2, and a press cylinder upper plate 9 is fixed at upper ends of the support poles 8. The support poles 8 may be erected directly on the base 1. An intermediate moving member (intermediate member) 10 is arranged under the press cylinder upper plate 9 through the support poles 8, an upper heater plate 11 is fixed under the intermediate moving member 10 via a heat-insulating plate, and an upper frame member 12 is fixed gas-tightly to an outer peripheral portion of a lower face of an upper heater plate 11, and extends downwardly. An inner frame body 13 is fixed to the lower face of the upper heater plate 11 inside the upper frame member 12. The upper heater 11 functions as a heater for softening a film, and the lower heater plate 5 functions as a heater for preheating a substrate or thermally curing an adhesive.

The inner frame body 13 has a frame-like press hold portion 13a at a lower end and rods 13b extending upwardly therefrom, springs are arranged around the rods 13b, and the rods 13b are fixed adiabatically to a lower face of the upper heater plate 11. The frame-like holding portion 13a is movable upwardly, while being urged downwardly relative to the rods 13b by the springs, and it mitigates impact when the frame-like holding portion 13a is brought into contact with the substrate-placing table 7. The frame-like holding portion 13a at the lower end of the inner frame body 13 functions to hold gas-tightly the below-mentioned pressurizing release film between the substrate-placing table 7.

A press cylinder 14 is arranged on an upper face of the press cylinder upper plate 9, a cylinder rod 15 of the press cylinder 14 is fixed to an upper face of the intermediate moving member 10 through the press cylinder upper plate 9, and the intermediate moving member 10, the upper heater plate 11 and the upper frame body 12 are movable integrally up and down by means of the press cylinder 14. In FIG. 1, "S" is a stopper for restraining downward movement of the intermediate moving member 10, the upper heater plate 11 and the upper frame body 12 by the press cylinder 14, and the stopper is brought into contact with a stopper plate on an upper face of a press cylinder body. As the press cylinder, a hydraulic cylinder, pneumatic ram, a servo cylinder or the like may be used. In the following, this is applicable.

The press cylinder 14 moves down the upper frame member 12 from a pull-up state, a lower end of the upper frame member 12 gas-tightly slides on a stepped portion provided on an outer peripheral end portion of the lower plate member, the press cylinder 14 is once stopped there, thereby a vacuum partition wall is formed by the upper heater plate 11, the upper frame member 12 and the lower plate member 6 in this state, while a vacuum chamber is defined inside the vacuum partition wall. In the upper frame member 12 is provided a vacuuming/pressurizing opening 16 for vacuuming/pressurizing the vacuum chamber.

The slidably moving table 3, the lower heater plate 5 and the lower plate member 6 are pulled outside together by the slide cylinder 4 in a state that the vacuum chamber is opened, a substrate A is placed on the substrate-placing table 7 outside the apparatus, and an element B such as a semiconductor, a resistance and/or a condenser or the like coated with an adhesive C on a lower face thereof is placed on the substrate. After a pressurizing release film D is placed on an upper face of the element B, the slidably moving table 3, the lower heater plate 5, the lower plate member 6, the substrate-placing table 7, the substrate A, the element B and the pressurizing release film D can be integrally transferred into the vacuum thermally bonding apparatus by the slide cylinder 4.

The pressurizing release film D to be used in the present invention is a heat-resistant film which will be inclined obliquely downwardly toward an outer peripheral portion from an edge of an upper face of the element when it is softened under heating in the atmospheric pressure, and the film has a property that it is stretched, while keeping a strength under heating. In the present invention, the heating temperature, which is the softening temperature of the pressurizing release film, is 100 to 300☐, for example. The material of the pressurizing release film D can be a resin or a rubber that is heat-resistant and easily softened, and its thickness is 30 to 500 µm, for example, which enables the film to be stretchable under heating, while maintaining the strength. As the pressurizing release film D, a heat-resistant release film may be used, and PET, olefin resin, fluorinated rubber or silicone rubber may be used, for example.

FIG. 2(a) to FIG. 2(d) are schematic views of principal portions showing steps in which the element is thermally bonded to the substrate under vacuum by heating with the pressurizing release film under vacuum by using the vacuum thermally bonding apparatus according to the first embodiment of the present invention.

(1) A Process Chart in which the Substrate, the Element and the Pressurizing Release Film are Set.

Figure 2A:
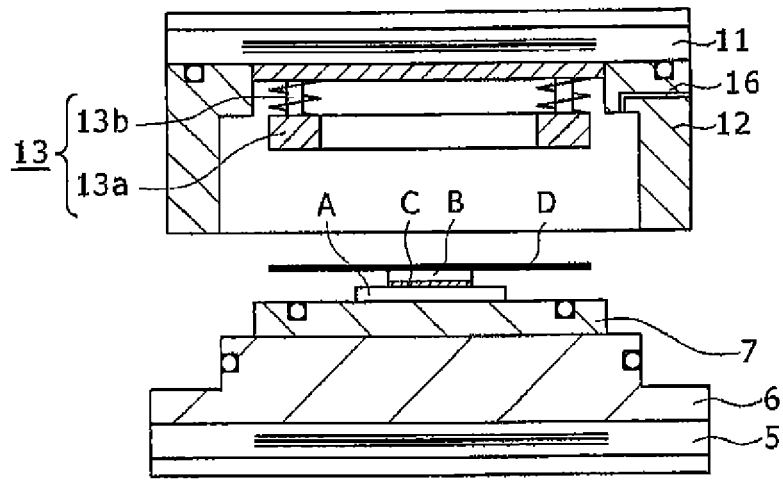
FIG. 2(a) is a schematic view of a principal portion for showing a setting step to thermally bond an element to a substrate with a pressurizing release film under vacuum by using the vacuum thermally bonding apparatus according to the first embodiment of the present invention.

FIG. 2(a) shows a step in which the substrate A, the element B and the pressurizing release film D are set. In this step, the intermediate moving member 10 is moved in a direction separating from the lower plate member 6 by the press cylinder, and while the vacuum chamber is opened, outside on the slidably moving table, the substrate A is placed on the upper face of the substrate-placing table 7, the element B having the adhesive C is placed on the upper face of the substrate A, the pressurizing release film D is placed on the upper face of the element B, while being extended above and outwardly from the substrate A such that the lower face of the inner frame body 13 may face opposed to the outer peripheral portion of the pressurizing release film D outside the substrate. They are introduced together into the vacuum thermally bonding apparatus by operating the slide cylinder. The adhesive may be applied to the element B, or applied to a face of the substrate A, or applied to both of the substrate and the element.

(2) Process Chart for the Formation of the Vacuum Partition Wall, the Softening of the Pressurizing Release Film and the Vacuum Evacuation.

Figure 2B:
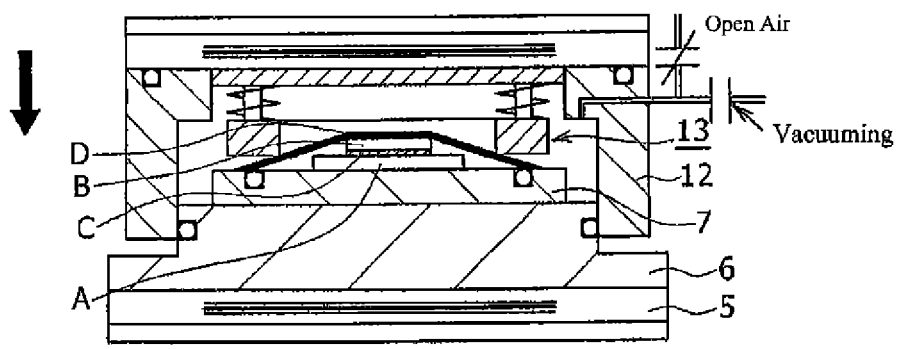
FIG. 2(b) is a schematic view of a principal portion for showing a vacuum partition wall-forming step to thermally bond the element to the substrate with the pressurizing release film under vacuum by using the vacuum thermally bonding apparatus according to the first embodiment of the present invention.

FIG. 2(b) shows a step in which the vacuum partition wall is formed to define the vacuum chamber therein, and after the pressurizing release film D is heated and softened in the atmospheric pressure, the vacuum evacuation is performed. In this step, the intermediate moving member is moved in a direction approaching the lower plate member 6 by the press cylinder, and the press cylinder is stopped once in a state in which the lower end of the upper frame member 12 is gas-tightly and slidably sealed to the peripheral portion of the lower plate member 6, thereby the vacuum partition wall is formed to define the vacuum chamber therein. In this embodiment, the peripheral portion of the lower plate member 6 is provided with a step to gas-tightly and slidably seal the lower end of the upper frame member 12. While the pressurizing release film D is contacted with the upper face of the element B, the film is softened under heating in the atmospheric pressure, and the vacuum chamber is evacuated through the vacuuming/pressurizing opening 16 to remove bubbles contained in the adhesive C. In this time, as shown in FIG. 2(b), the pressurizing release film D is inclined downwardly from the edge of the upper face of the element B toward the outer peripheral edge portion, and its outermost peripheral edge of the outer peripheral portion extends up to a position corresponding to the lower face of the lower end 13a of the inner member, and contacts the upper face of the substrate-placing plate 7.

(3) Step for Holding the Pressurizing Release Film

Figure 2C:
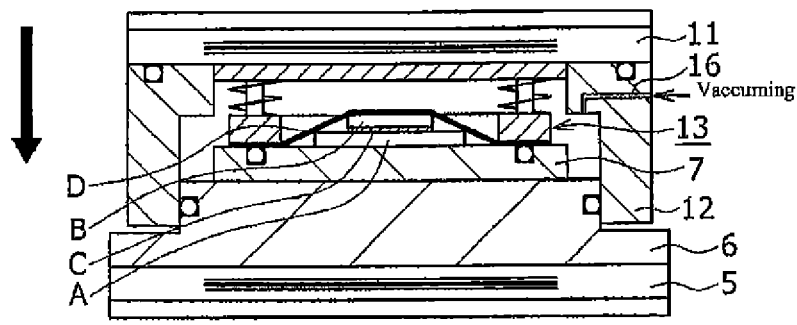
FIG. 2(c) is a schematic view of a principal portion for showing a pressurizing release film-holding step to thermally bond the element to the substrate with the pressurizing release film under vacuum by using the vacuum thermally bonding apparatus according to the first embodiment of the present invention.

FIG. 2(c) shows a step for gas-tightly holding the outer peripheral portion of the pressurizing release film softened by heating under vacuum onto the upper face of the substrate-placing table 7 at the lower face of the lower end portion 13a of the inner member 11. While the vacuum chamber is being evacuated, the upper member 12 is further gas-tightly slidably sealed to the lower plate member 6 by the press cylinder, and is stopped when the stopper of the press cylinder 14 is brought into contact with the stopper plate of the press cylinder body. The position at which the stopper stops is a position at which the lower face of the lower end portion of the lower end of the inner member is brought into the gas-tight contact with the upper face of the substrate-placing table 7. At this time, the outer peripheral portion of the pressurizing release film D is kept in a gas-tight state between the upper face of the substrate-placing table 7 and the lower face of the inner frame body 13, so that an inner side of the pressurizing release film D where the substrate A and the element B are positioned is kept in a vacuum state. Further, when the press cylinder is to be stopped, the upper frame member 7 may be brought into contact with the lower plate member 6, without using the stopper of the press cylinder.

(4) Step for Bonding the Element to the Substrate by Adhering the Pressurizing Release Film to the Outer Surfaces of the Substrate and the Element.

Figure 2D:
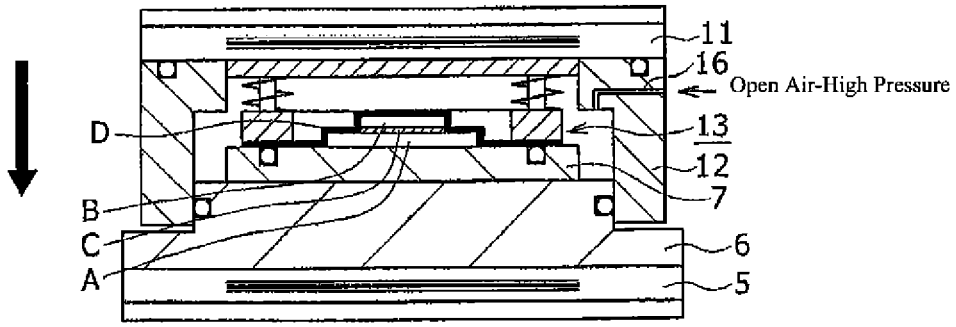
FIG. 2(d) is a schematic view of a principal portion for showing an element-bonding step to thermally bond the element to the substrate with a pressurizing release film under vacuum by using the vacuum thermally bonding apparatus according to the first embodiment of the present invention.

FIG. 2(d) shows a step for bonding the element B to the substrate A by applying a pressure onto the outer surface of the pressurizing release film D and thereby adhering the pressuring release film D onto the outer surfaces of the substrate A and the element B. In this step, the evacuation of the interior of the vacuum chamber through the vacuuming/pressurizing opening 16 is stopped, a pressurizing gas such as the atmosphere, a pressure-elevated air or the like is introduced into the vacuum chamber under heating, a pressure is applied to the outer surface of the pressurizing release film D, the pressurizing release film D is adhered onto the outer surfaces of the substrate A and the element B, and the element B is bonded and joined to the substrate A. After this step is terminated, the vacuum partition wall is opened, the element bonded to the substrate A is taken outside from the vacuum thermally bonding apparatus by the slidably moving table under operation of the slide cylinder. As the pressurizing gas, a pressurizing gas involving the above-mentioned atmosphere and pressurized gas such as pressurized air, a steam or the like may be used. This is also applicable to the other embodiments.

Next, a second embodiment of the vacuum thermally bonding apparatus will be explained in FIG. 3(a) to FIG. 3(d). The second embodiment differs from the first one in that regarding the second embodiment, a sealing sheet E is inserted between an element B on a substrate A and a pressurizing release film D and a element-provided substrate is sealed.

Figure 3A:
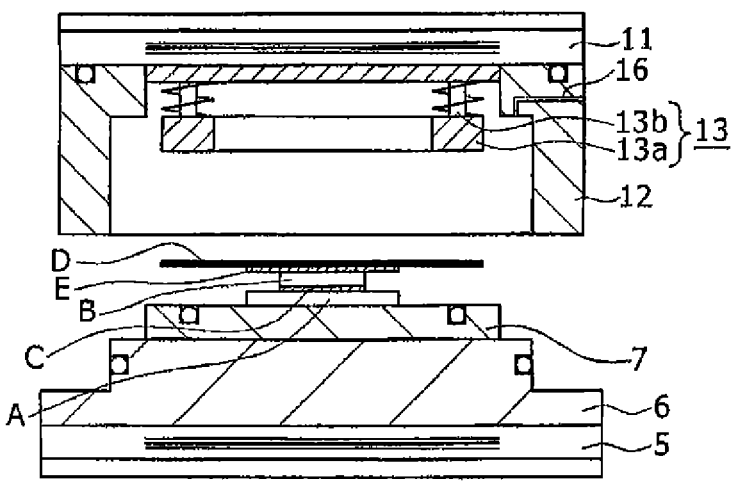
FIG. 3(a) is a schematic view of a principal portion for showing a setting step to thermally bond an element of an element-provided substrate to the substrate with a pressurizing release film and a sealing sheet under vacuum by using a vacuum thermally bonding apparatus according to a second embodiment of the present invention.
Figure 3A:
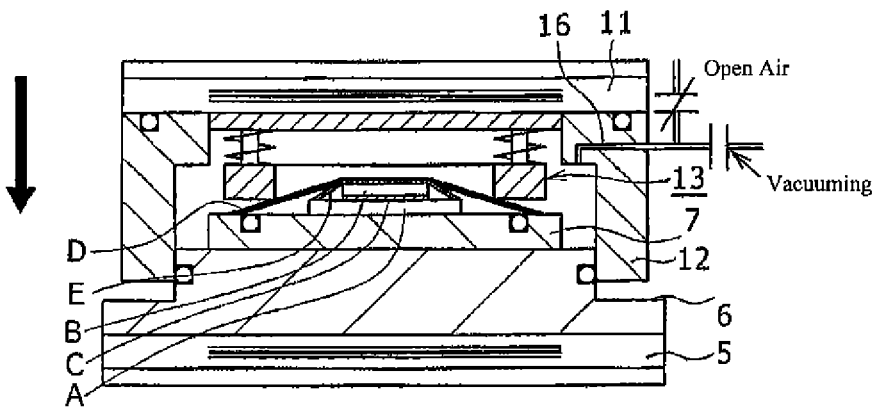

(1) Step for Setting an Element-Provided Substrate, a Sealing Sheet and a Pressurizing Release Film on a Substrate-Placing Table FIG. 3(a) shows a step for setting an element-provided substrate, a sealing sheet and a pressurizing release film on a substrate-placing table. In this embodiment, a substrate A with an element B, a sealing sheet E and a pressurizing release film D are set on a substrate-placing table 7 in order. The outer dimension of the sealing sheet E is such a size that when the pressurizing release film D is gas-tightly held between an upper face of the substrate-placing table 7 and a lower face of an inner frame member 13a, the sealing sheet E is not held between the upper face of the substrate-placing table 7 and the lower face of the inner frame member 13a, and it is a size necessary for sealing the element-provided substrate. The sealing sheet E gas-tightly seal the element onto the substrate. In this case, the element-provided substrate means one in which the element is preliminarily bonded and fixed onto the substrate via an adhesive before the setting step.

The sealing sheet E to be used in the present invention is an adhesion sheet for sealing, the sealing sheet is placed on the element, and a resin is fluidized under heating and pressurizing, thereby performing the sealing. It is a bonding/sealing thin sheet having a thickness of around 0.2 to 5 mm, for example. The thermally softened sealing sheet is adhered onto the outer surface of the element-provided substrate, thereby sealing the element-provided substrate and supplementally bonding the element-provided substrate from the outer surface thereof. As the sealing sheet, an epoxy resin, an urethane rubber, a silicone rubber or the like can be used, which functions as an adhesive layer to be cured under heating.

(2) Step for Forming a Vacuum Partition Wall, Softening the Sealing Sheet and the Pressurizing Release Film and Vacuum Evacuation FIG. 3(b) shows a step for forming a vacuum partition wall, softening the sealing sheet and the pressurizing release film and vacuum evacuation. As shown in FIG. 3(b), an upper heater plate 11 is descended by a press cylinder, a lower end portion of the upper frame member 12 is gas-tightly and slidably sealed to a step of an outer peripheral portion of the lower plate member 6, the vacuum partition wall is formed and a vacuum chamber is formed therein, and the descending of the upper heater plate 11 is once stopped. In this state, the pressurizing release film D and the sealing sheet E are thermally softened under the atmospheric pressure, the vacuum chamber is evacuated, and bubbles between the outer surface of the substrate A with the element B and the sealing sheet are removed. In FIG. 3(b), the sealing sheet E is inclined toward an edge of the outer peripheral portion from an edge of the upper face of the element B, and reaches the upper face of the substrate-placing table 7. Further, the pressurizing release film D is positioned outside of the sealing sheet, and inclined from the edge of the upper face of the element B and contacts the upper face of the substrate-placing table 7 at the outer peripheral portion.

(3) Step for Holding the Pressurizing Release Film

Figure 3C:
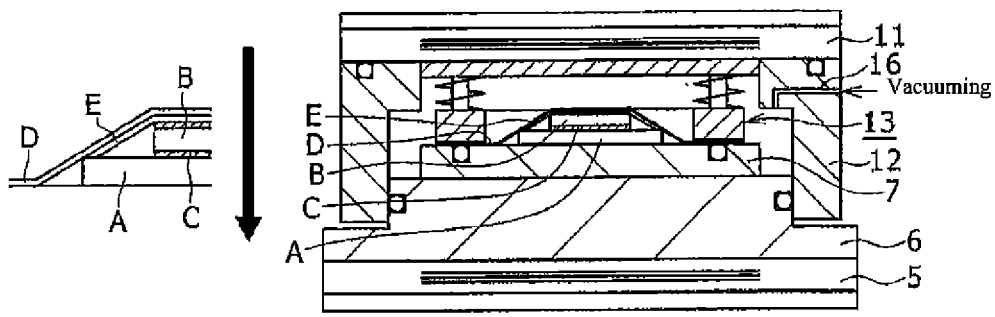
FIG. 3(c) is a schematic view of a principal portion for showing a pressurizing release film-holding step to thermally bond the element of the element-provided substrate to the substrate with the pressurizing release film and the sealing sheet under vacuum by using the vacuum thermally bonding apparatus according to the second embodiment of the present invention.

As shown in FIG. 3(c), the upper heater plate 11 is further descended by the press cylinder, a peripheral portion of the lower plate member is slidably sealed with the lower face of the lower end of the upper frame member 12, and it is stopped upon contact of the stopper of the press cylinder. The stopper-stopped position is a position in which the lower face of the lower end of the inner member is gas-tightly sealed to the upper face of the substrate-placing table 7. The sealing sheet E is positioned inside the pressurizing release film D. At this time, the inside and the outside of the pressurizing release film D are kept in a vacuum state. FIG. 3(c) is an enlarged view showing the state of the sealing sheet E and the pressurizing release film D placed on the substrate A with the element B on the substrate-placing table. In this case, in order to stop the movement, the upper frame member 7 may be brought into contact with the lower frame member 6 without using the stopper of the press cylinder.

(4) Step for Adhering the Sealing Sheet and the Pressurizing Release Film onto the Outer Surface of the Element-Provided Substrate and Sealingly Bonding the Element to the Substrate.

Figure 3D:
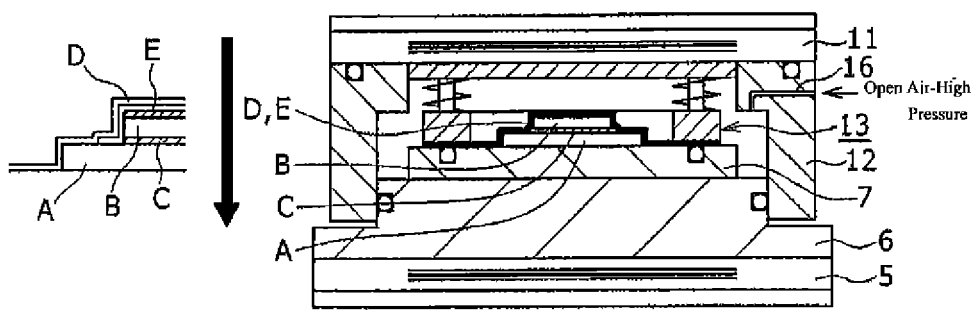
FIG. 3(d) is a schematic view of a principal portion for showing an element-bonding step to thermally bond the element of the element-provided substrate to the substrate with the pressurizing release film and the sealing sheet under vacuum under vacuum by using the vacuum thermally bonding apparatus according to the second embodiment of the present invention.

FIG. 3(d) shows a step for adhering the sealing sheet and the pressurizing release film onto the outer surfaces of the element-provided substrate and sealingly bonding the element to the substrate. When a gas such as air or the like having the atmospheric pressure or a pressure higher than the atmospheric pressure is introduced into the vacuum chamber through the vacuuming/pressurizing opening 16, as shown in FIG. 3(d), the thermally softened sealing sheet E is adhered onto the outer surface of the element-provided substrate A with the thermally softened pressurizing release film D, so that and the element-provided substrate can be sealed and bonded by adhering the sealing sheet onto the outer surfaces of the substrate A and the element B on the substrate A. FIG. 3(d) shows a state in an enlarged view of the sealing sheet E and the pressurizing release film D adhered onto the outer surface of the substrate A with the element B on the substrate-placing table.

Next, a vacuum thermally bonding apparatus according to a third embodiment of the present invention will be explained in FIG. 4(a) to FIG. 4(d). In this embodiment, a pressurizing release film D is fixed to a face of a lower end of a inner frame body 18. In FIG. 4(a) to FIG. 4(d), a case with no sealing sheet E is explained, but if a sealing sheet E is provided, the sealing sheet E is positioned on an upper face of the element B.

Figure 4A:
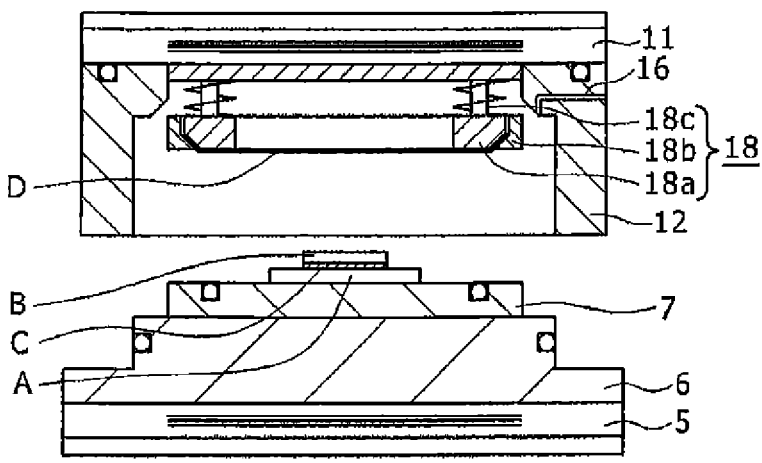
FIG. 4(a) is a schematic view of a principal portion for showing a setting step to thermally bond an element to a substrate with a pressurizing release film fixed to an inner frame body under vacuum or to thermally bond an element of an element-provided substrate to the substrate under vacuum with a pressurizing release film and a sealing sheet by using a vacuum thermally bonding apparatus according to a third embodiment of the present invention.

(1) Step for Setting the Substrate, the Element and the Pressurizing Release Film on the Substrate-Placing Table FIG. 4(a) shows a step for setting the substrate and the element (and further a sealing sheet, if it is inserted) on the substrate-placing table. In this embodiment, an inner frame body 18 has a frame-like holding portion 18a, a pressurizing release film-stopping ring 18b screwed to its outer peripheral portion, and rods 18c extending upwardly from the frame-like holding portion 18a, and the rods 18c are fixed to the upper heater plate 11. The frame-like holding portion 18a is downwardly urged and upwardly movable relative to the rods 18c by means of springs, which mitigates an impact occurred when the frame-like holding portion 18a is brought into contact with the substrate-placing table 7. The pressurizing release film D is stretched in a state that it is stretched toward the lower face of the frame-like holding portion 18a, its outer peripheral portion is detachably held between the frame-like holding portion 18a and the pressurizing release film-stopping ring 18b. The pressurizing release film is fixed by screwing fixture, screwing joint, one-touch fixture, or the like.

Figure 4B:
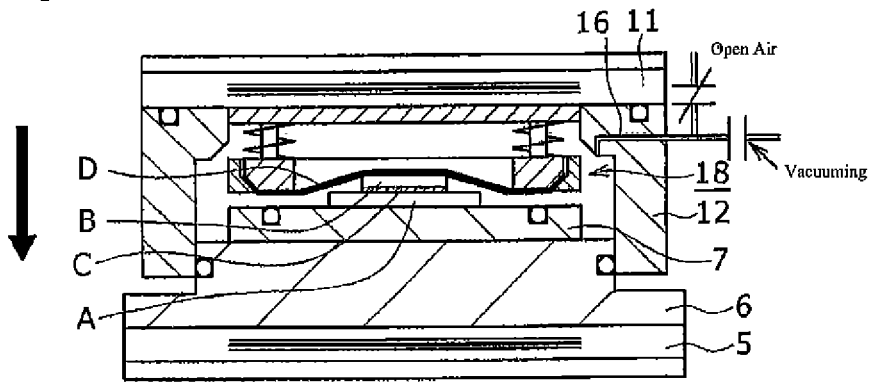
FIG. 4(b) is a schematic view of a principal portion for showing a vacuum partition wall-forming step to thermally bond the element to the substrate with the pressurizing release film fixed to the inner frame body under vacuum or to thermally bond the element of the element-provided substrate to the substrate with the pressurizing release film and the sealing sheet under vacuum by using the vacuum thermally bonding apparatus according to the third embodiment of the present invention.

(2) Step for Forming the Vacuum Partition Wall, Softening the Pressurizing Release Film and Vacuum Evacuation FIG. 4(b) shows a step for forming the vacuum partition wall, softening the pressurizing release film and vacuum evacuation. As shown in FIG. 4(b), the upper heater plate 11 is descended by the press cylinder, and the lower end of the upper frame member 12 is gas-tightly and slidably sealed to a step of an outer peripheral portion of the lower plate member 6, so that the vacuum partition wall is formed and the vacuum chamber is formed therein. In this stage, the descending of the upper heater plate 11 is once stopped. At this time, the pressurizing release film D is thermally softened under the atmospheric pressure, and adhered onto the upper face of the element. While the vacuum chamber is evacuated to vacuum, bubbles of the adhesive C between the upper face of the substrate A and the lower face of the element B are removed.

(3) Step for Holding the Pressurizing Release Film

Figure 4C:
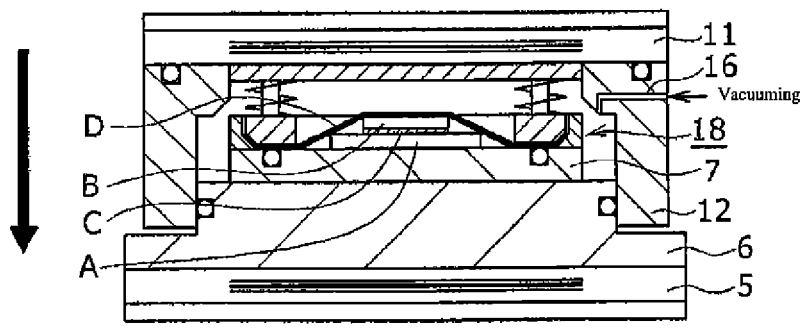
FIG. 4(c) is a schematic view of a principal portion for showing a pressurizing release film-holding step to thermally bond the element to the substrate with the pressurizing release film fixed to the inner frame body under vacuum or to thermally bond the element of the element-provided substrate to the substrate with the pressurizing release film and the sealing sheet under vacuum by using the vacuum thermally bonding apparatus according to the third embodiment of the present invention.

FIG. 4(c) shows a step for holding the pressurizing release film. As shown in FIG. 4(c), the upper heater plate 11 is further descended by the press cylinder, the lower face of the lower end of the upper frame member 12 is slidably sealed to the lower plate member 6, whereas the press cylinder is stopped upon contact with the stopper. The stopper-stopping position is a position where the lower face of the lower end of the inner member is gas-tightly sealed to the upper face of the substrate-placing table 7. When the press cylinder is to be stopped, it can be stopped by bringing the lower plate member 6 into contact with the upper frame member 7, without using the stopper for the press cylinder.

Figure 4D:
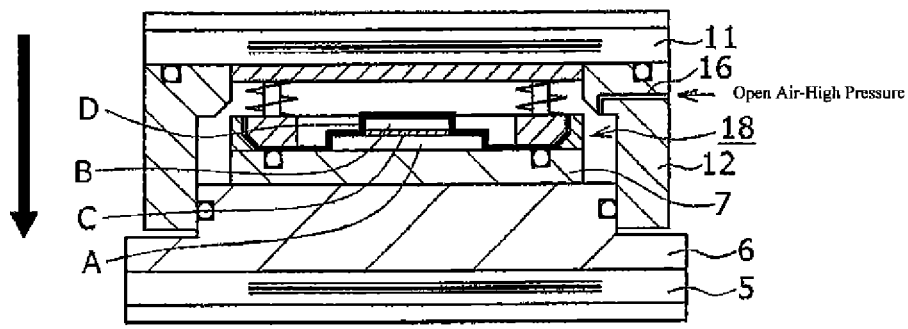
FIG. 4(d) is a schematic view of a principal portion for showing element bonding step to thermally bond the element to the substrate with the pressurizing release film fixed to the inner frame body under vacuum or to thermally bond the element of the element-provided substrate to the substrate with the pressurizing release film and the sealing sheet under vacuum by using the vacuum thermally bonding apparatus according to the third embodiment of the present invention.

(4) Step for Bonding the Element to the Substrate by Adhering the Pressurizing Release Film to the Outer Surfaces of the Substrate and the Element FIG. 4(d) shows a step for bonding the element to the substrate by adhering the pressurizing release film to the outer surfaces of the substrate and the element. When a gas such as air or the like having the atmospheric pressure or a pressure higher than the atmospheric pressure is introduced into the vacuum chamber under heating through the vacuuming/pressurizing opening 16, as shown in FIG. 4(d), the thermally softened pressurizing release film D can be adhered onto the outer surfaces of the substrate A and the element C on the substrate. Thereby, the adhesive C is thermally cured between the upper face of the substrate and the lower face of the element, without running outside, so that the bonding layer having an appropriate thickness can be formed.

FIG. 5(a) to FIG. 5(d) show a vacuum thermally bonding apparatus according to a fourth embodiment of the present invention. In FIG. 5(a) to FIG. 5(d), a case without a sealing sheet E is explained, but in a case with a sealing sheet E, the sealing sheet E is positioned on an upper face of an element B. In this vacuum thermally bonding apparatus, a pressurizing release film-holding jig 20 is gas-tightly placed on an upper face of a lower plate member 6 and on an outer surface of a substrate-placing table 7 via a spring. The pressurizing release film-holding jig 20 comprises a jig upper portion 20a and a jig ring 20b, and the jig ring 20b is screwed to an outer periphery of the jig upper portion 20a, and an outer peripheral portion of the pressurizing release film D is held therebetween. The pressurizing release film D is stretched with a lower face of the jig ring 20b, and the outer peripheral portion of the film is detachably held between the jig upper portion 20a and the jig ring 20b. In this embodiment, while the pressurizing release film-holding jig 20 is placed on the upper face of the substrate-placing table 7 with a slight ventilatable gap provided, and the pressurizing release film D is adhered onto the upper face of the element B on the substrate A. Ventilation grooves 22 are provided in peripheral portions of the jig upper portion 20a and the jig ring 20b.

An inner frame body 19 has a plate-like press portion 19a at a lower end and rods 19b extending upwardly therefrom, and the rods 19b are fixed to an upper heater plate, and around the rod 19b is arranged a spring to lift the jig ring. The plate-like holding portion 19a is designed to be moved up and down by the spring, and when the inner frame body 19 is brought into contact with the upper face of the pressurizing release film-holding jig 20, jig ring-lifting springs are shrunk for contacting, and mitigate an impact at that time.

Figures 5A, 5B:
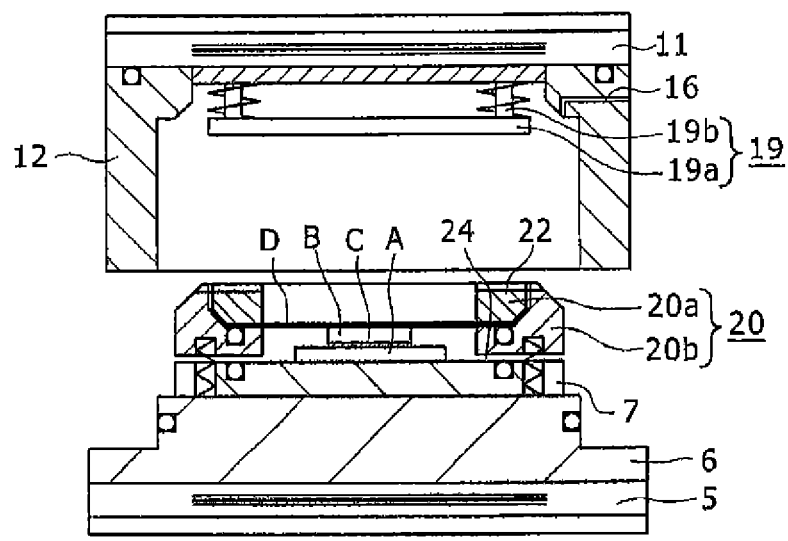
FIG. 5(a) is a schematic view of a principal portion for showing a setting step to thermally bond an element to a substrate with a pressurizing release film fixed to a pressurizing release film-holding jig on a lower plate member under vacuum by using the vacuum thermally bonding apparatus according to a fourth embodiment of the present invention.
FIG. 5(b) is a schematic view of a principal portion for showing a vacuum partition wall-forming step to thermally bond the element to the substrate with the pressurizing release film fixed to the pressurizing release film-holding jig under vacuum by using the vacuum thermally bonding apparatus according to the fourth embodiment of the present invention.

(1) Step for Setting the Substrate, the Element and the Pressurizing Release Film on the Substrate-Placing Table FIG. 5(a) shows a step for setting the substrate, the element and the pressurizing release film on the substrate-placing table. While the vacuum chamber is opened, the substrate A is placed on the upper face of the substrate-placing table 7 above the slidably moving table outside the apparatus, and the element B having the adhesive C is arranged on the upper face of the substrate A. If a sealing sheet is used, the sealing sheet is arranged on the upper face of the element B. The pressurizing release film-holding jig 20 holding the pressurizing release film D is placed on an upper face of a lower plate member 6 and a slight ventilatable gap provided on the upper face of the substrate-placing table 7, and they are introduced into the vacuum thermally bonding apparatus by operating a slide cylinder.

(2) Step for Forming a Vacuum Partition Wall, Softening the Pressurizing Release Film and Vacuum Evacuation FIG. 5(b) shows a step for forming a vacuum partition wall, softening the pressurizing release film and vacuum evacuation. As shown in FIG. 5(b), the upper heater plate 11 is descended by a press cylinder, and a lower end portion of an upper frame member 12 is gas-tightly slidably sealed to a step at an outer peripheral portion of a lower frame member 6, so that the vacuum partition wall is formed and a vacuum chamber is formed therein. In this stage, the descending of the upper heater plate 11 is once stopped. In this state, the pressurizing release film D is softened under heating in the atmospheric pressure, the vacuum chamber is evacuated to vacuum, and bubbles in the adhesive C between the upper face of the substrate A and the lower face of the adhesive B are removed.

(3) Step for Holding the Pressurizing Release Film

Figure 5C:
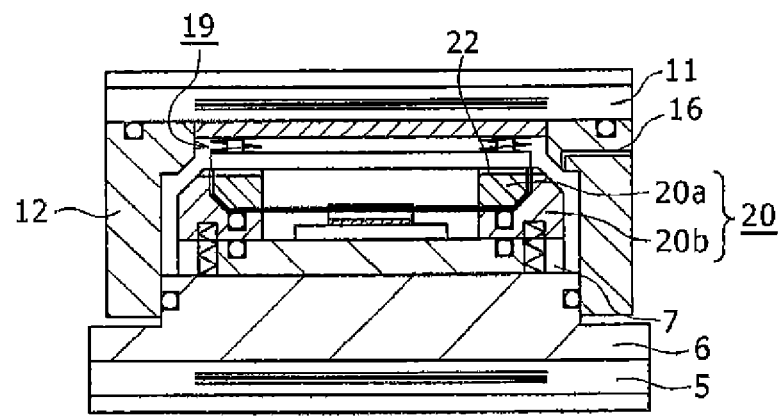
FIG. 5(c) is a schematic view of a principal portion for showing a pressurizing release film-holding step to thermally bond the element to the substrate with the pressurizing release film fixed to the pressurizing release film-holding jig under vacuum by using the vacuum thermally bonding apparatus according to the fourth embodiment of the present invention.

FIG. 5(c) shows a step for holding the pressurizing release film. As shown in FIG. 5(c), the upper heater plate 11 is further descended by the air cylinder, the lower face of the low end of the upper frame member 12 slides, and on the other hand, the press cylinder is stopped upon contact with a stopper. The stopping position of the stopper is a position where the lower face of the lower end of the inner member is gas-tightly sealed to the upper face of the substrate-placing table 7. The inside and outside of the pressurizing release film D are kept in vacuum.

Figure 5D:
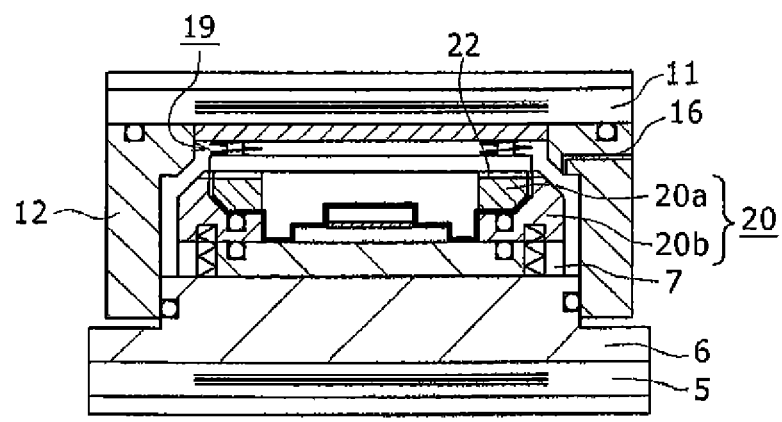
FIG. 5(d) is a schematic view of a principal portion for showing an element-bonding step to thermally bond the element to the substrate with the pressurizing release film fixed to the pressurizing release film-holding jig under vacuum by using the vacuum thermally bonding apparatus according to the fourth embodiment of the present invention.
Figure 6A:
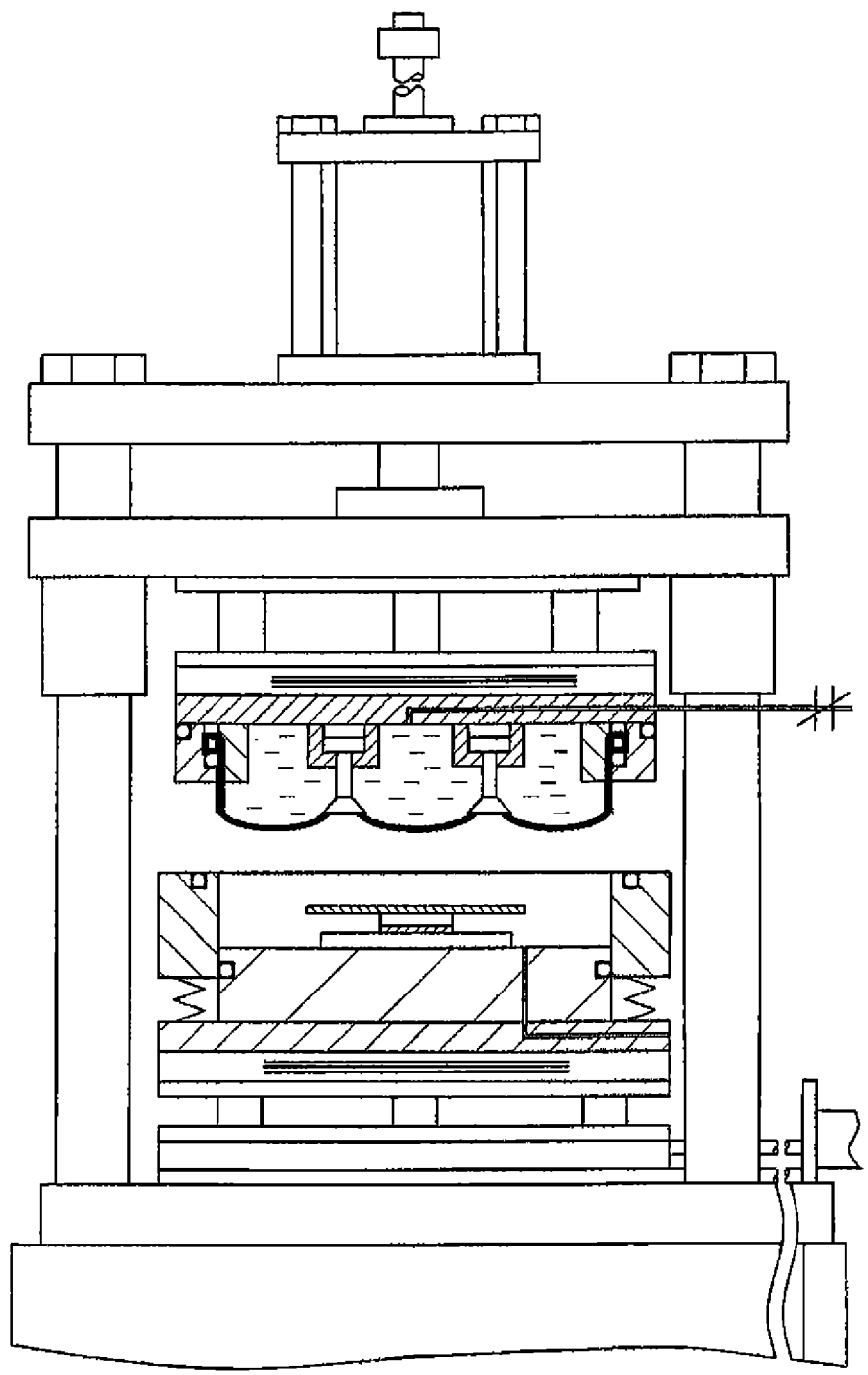
FIG. 6(a) is an illustrating view for showing a setting step to thermally bond an element to a substrate with a sealing sheet under vacuum by using a conventional thin plate-like workpiece hot pressing apparatus.
Figure 6B:
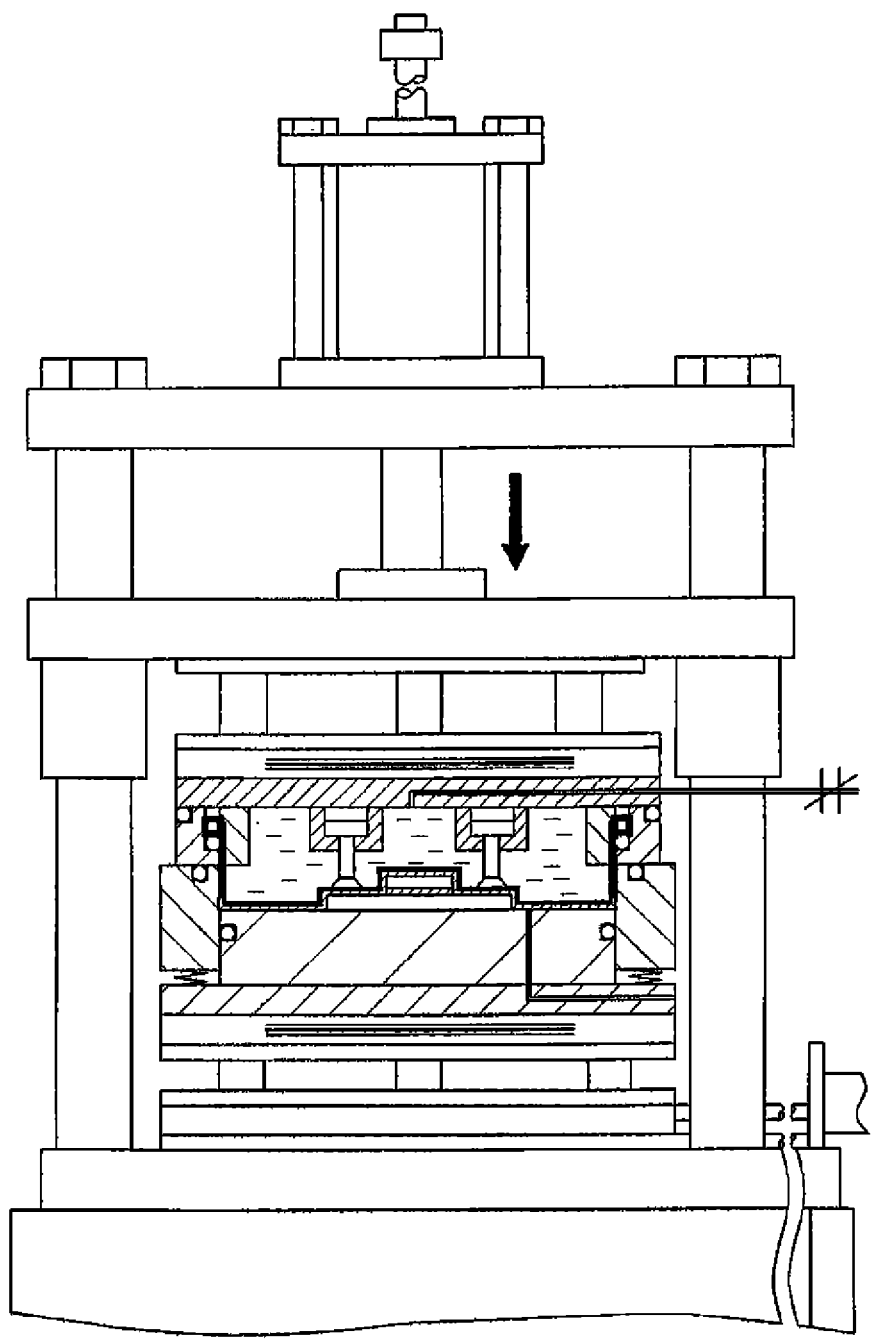
FIG. 6(b) is an illustrating view for showing an element-bonding step to thermally bonding the element to the substrate with a sealing sheet under vacuum by using the conventional thin plate-like workpiece hot pressing apparatus.

(4) Step for Adhering the Pressurizing Release Film on Outer Surfaces of the Substrate and the Element FIG. 5(d) shows a step for adhering the pressurizing release film on outer surfaces of the substrate and the element. When a gas such as air or the like having the atmospheric pressure or a pressure higher than the atmospheric pressure is introduced into the vacuum chamber under heating through a vacuuming/pressurizing opening 16 and the ventilation hole or ventilation groove 21, as shown in FIG. 5(d), the thermally softened pressurizing release film D is adhered on the outer surfaces of the substrate A and the element B on the substrate. Thereby, the adhesive C is thermally cured between the upper face of the substrate and the lower face of the element without running outside, so that a bonding layer having an appropriate thickness can be formed.

Although the vacuum thermally bonding apparatus according to the present invention has been explained based on the concrete embodiments, the invention is not limited thereto. For example, the following are encompassed by the present invention.

(1) In the above embodiments, one element is placed on the substrate, a plurality of elements such as semiconductors, resistances and/or condensers and the like may be placed on the substrate. The present invention also involves a case with the elements having the same height and a case with those having different heights are involved in the present invention.

(2) When the sealing sheet is a UV-curable film, a UV light source and a UV-transmitting window that constitutes a part of the vacuum partition wall are provided so that UV can be transmitted upon the pressurizing release film.

(3) It may be that an auxiliary cylinder is arranged adiabatically on the upper face of the upper heater plate, the upper heater plate 11 is descended by the press cylinder 14, and the inner frame body is descended relative to the upper heater plate 11 by the auxiliary air cylinder, thereby bringing it into contact with the upper face of the substrate-placing table 7.

(4) Although the press cylinder is arranged on the press cylinder upper plate in the above-mentioned embodiments, the press cylinder may be provided under the moving table or for the press cylinder lower plate, so that the lower heater plate, the lower plate member and the substrate-placing table arranged on the moving table can be moved up and down together.

(5) Although the thermally softening method with the heater has been described, the targeted joining with the adhesive can also be applied to a hot melt adhesive, a thermosetting adhesive, a UV-curable adhesive, a room-temperature curable adhesive and the like.

(6) After the step for forming the vacuum partition wall, softening the pressurizing release film and vacuum evacuation, it may be that the pressurizing release film-holding step is performed, a gas such as air or the like having the atmospheric pressure or a pressure higher than the atmospheric pressure is introduced into the vacuum chamber under heating through the vacuuming/pressurizing opening, the thermally softened pressurizing release film D is adhered onto the outer surfaces of the substrate A and the element on the substrate, the vacuuming/pressurizing opening is closed in the partially cured state, and then the press cylinder is descended again to further increase the inner pressure inside the vacuum chamber. In this case, the pressurizing power between the substrate and the element increases, and the adhesion can be enhanced under a higher pressurizing pressure, while the thickness of the adhesive is being maintained.

What is claimed is:

1. A vacuum thermally bonding apparatus for thermally bonding an element onto a substrate under vacuum, said vacuum thermally bonding apparatus comprising:
(a) a base,
(b) a press cylinder lower plate arranged on the base,
(c) a lower heater plate arranged adiabatically above the press cylinder lower plate,
(d) a lower plate member arranged on an upper face of the lower heater plate, a substrate-placing member arranged on the lower plate member,
(e) supporting posts erected on the base,
(f) a press cylinder upper plate fixed to upper portions of the supporting posts,
(g) an intermediate member arranged under the press cylinder upper plate,
(h) an upper heater plate arranged adiabatically under the intermediate member,
(i) an upper frame member arranged gas-tightly on a lower face of the upper heater plate, a lower end of the upper frame member being gas-tightly sealable on a peripheral portion of the lower plate member,
(j) an inner frame body attached to a lower face of the upper heater plate within the upper frame member, an lower end face of the inner frame body being positioned above an upper face of the lower plate member, and the lower end face of the inner frame body being brought into gas-tight contact with an upper face of the substrate-placing table when the inner frame body and the substrate-placing table are approached and brought into contact with each other,
(k) a driving unit that moves at least one of the lower plate member and the intermediate member relative to each other in an approaching direction, to form a vacuum partition wall defining a vacuum chamber by gas-tightly and slidably sealing the lower end of the upper frame member to the peripheral portion of the lower plate member, to gas-tightly bring the lower end face of the inner frame body into contact with the upper face of the substrate-placing table by further moving at least one of the lower plate member and the intermediate member relative to each other in the approaching direction, and to move at least one of the lower plate member and the intermediate member relative to each other in a separating direction, and
(l) a vacuuming or pressurizing opening for deaerating to vacuum or pressurizing the vacuum chamber inside the vacuum partition wall,
(m) wherein the vacuum chamber is opened by moving at least one of the lower plate member and the intermediate member relative to each other in the separating direction with the driving unit,
(n) the substrate is placed on an upper face of the substrate-placing table, the element is placed on an upper face of the substrate via an adhesive; a pressurizing release film is placed on or above an upper face of the element, while being extended above and outside the substrate and the outer peripheral portion of the pressurizing release film and the lower face of the inner frame body are opposed to each other outside the substrate;
(o) by moving at least one of the lower plate member and the intermediate member relative to each other in the approaching direction with the driving unit, the lower end of the upper frame member is gas-tightly slidably sealed to the peripheral portion of the lower plate member and the vacuum partition wall to define the vacuum chamber therein is formed, (p) the pressurizing release film is contacted with the upper face of the element, and softened under heating in the atmospheric pressure, (q) the vacuum chamber is evacuated to vacuum via the vacuuming or pressurizing opening, (r) the outer peripheral portion of the pressurizing release film is gas-tightly held between the upper face of the substrate-placing table and the lower face of the inner frame body by further moving at least one of the lower plate member and the intermediate member relative to each other in the approaching direction by means of the driving unit; and (s) by applying the atmospheric pressure or a pressure higher than the atmospheric pressure to a space above the pressurizing release film inside the vacuum chamber via the vacuuming or pressurizing opening in this state, the pressurizing release film is adhered to the outer surfaces of the substrate and the element, and the element is bonded to the substrate.

2. The vacuum thermally bonding apparatus set forth in claim 1, wherein a plurality of elements are placed on the upper face of the substrate.

3. The vacuum thermally bonding apparatus set forth in claim 1, wherein the pressurizing release film is arranged on the upper face of the element or on the sealing sheet on the upper face of the element, while being arranged above the substrate and extended outwardly from the sealing sheet, and the outer periphery of the pressurizing release film is opposed to the lower face of the inner frame body.

4. The vacuum thermally bonding apparatus set forth in claim 1, wherein the pressurizing release film is detachably fixed to the lower end face of the inner frame member.

5. The vacuum thermally bonding apparatus set forth in claim 1, wherein a pressurizing release film-holding jig is arranged around the substrate and on an upper face of the substrate-placing table, the outer periphery of the pressurizing release film is detachably fixed to the pressurizing release film-holding jig; in a state that the pressurizing release film-holding jig is arranged around the substrate, while a slight ventilatable gap is provided on the lower plate member via a spring, the pressurizing release film is arranged on or above the upper face of the element on the substrate, or on or above the sealing sheet on the upper face of the element; by moving at least one of the lower plate member and the intermediate member relative to each other with the driving unit in the approaching direction, the lower end portion of the upper frame member is gas-tightly slidably sealed to the peripheral portion of the lower plate member, thereby forming the vacuum partition wall to define the vacuum chamber; after the pressurizing release film is softened under heating in the atmosphere, the vacuum chamber is evacuated to vacuum through the vacuuming or pressurizing opening; by further moving at least one of the lower plate member and the intermediate member relative to each other with the driving unit in the approaching direction, the pressurizing release film-holding jig is slidably brought into gas-tight contact with the upper face of the lower plate member, thereby holding a space between the pressurizing release film and the upper face of the lower plate member in vacuum; and in this state the atmospheric pressure or a pressure higher than the atmospheric pressure is applied into a space above the pressurizing release film within the vacuum partition wall through the vacuuming or pressurizing; opening, thereby the pressurizing release film is adhered onto the outer surfaces of the substrate and the element.

6. The vacuum thermally bonding apparatus set forth in claim 4, wherein a slide table is laterally movably arranged on the upper face of the base, the lower heater plate is arranged adiabatically on the slide table, the slide table-moving device is provided to move the slide table; in a state that the upper frame member is moved upwardly, the slide table, the lower heater plate and the lower plate member can be taken out by the slide table-moving device, the slide table, the lower heater plate and the lower plate member can be moved to under the upper frame member inside the vacuum thermally bonding apparatus by the slide table-moving device; the substrate is place on the substrate-placing table, and the element is placed on the substrate, or the element-provided substrate is placed on the substrate-plating table and the sealing sheet is placed on the element of the element-provided substrate, the slide table-moving device enables the slide table, the lower heater plate and the lower plate member to move to under the upper frame member within the vacuum thermally bonding apparatus and to take out the substrate and the element having undergone a bonding treatment or the element-provided substrate having undergone a sealing and bonding treatment with the sealing sheet.

7. The vacuum thermally bonding apparatus set forth in claim 5, wherein a slide table is laterally movably arranged on the upper face of the base, the lower heater plate is arranged adiabatically on the slide table, a slide table-moving device is provided to move the slide table; in a state that the upper frame member is moved upwardly, the slide table, the lower heater plate and the lower plate member can be taken outside by the slide table-moving device, whereas the slide table, the lower heater plate and the lower plate member can be moved to under the upper frame member inside the vacuum thermally bonding apparatus by the slide table-moving device; the substrate is placed on the substrate-placing table, and the element is placed on the substrate, or the element-provided substrate is placed on the substrate-placing table, and the sealing sheet is placed on the element of the element-provided substrate, the pressurizing release film-holding jig is arranged on the upper face of the substrate-placing table and around the substrate; by the slide table-moving device, the slide table, the lower heater plate and the lower plate member can be moved to under the upper frame member inside the vacuum thermally bonding apparatus and the substrate and the element having undergone a bonding treatment or the element-provided substrate having undergone a sealing/bonding treatment with the sealing sheet can be taken out.

8. The vacuum thermally bonding apparatus set forth in claim 1, wherein the intermediate plate is slidable relative to the supporting posts under the press cylinder upper plate, the upper heater plate is fixed adiabatically to the lower face of the intermediate plate, a moving cylinder is provided above the press cylinder upper plate as the driving unit, and the lower end of a cylinder rod of the moving cylinder is fixed to the intermediate plate through the press cylinder upper plate.

9. The vacuum thermally bonding apparatus set forth in claim 1, wherein a slide table is laterally movably arranged on the upper face of the base, the lower heater plate is arranged adiabatically on the slide table, a slide table-moving device is provided to move the slide table; in a state that the upper frame member is moved upwardly, the slide table, the lower heater plate and the lower plate member are taken outside by the slide table-moving device, whereas the slide table, the lower heater plate and the lower plate member are movable to under the upper frame member within the vacuum thermally bonding apparatus by the slide table-moving device; the substrate is placed on the substrate-placing table, the element is placed on the substrate, and the pressurizing release film is placed on the element, or alternatively, the element-provided substrate is placed on the substrate-placing table, the sealing sheet is placed on the element of the element-provided substrate, and the pressurizing release film is placed on the sealing sheet; the slide table, the lower heater plate and the lower plate member are movable to under the upper frame member inside the vacuum thermally bonding apparatus by the slide table-moving device; and the substrate and the element having undergone a bonding treatment and the pressurizing release film, or the element-provided substrate having undergone a sealing and bonding treatment with the sealing sheet can be taken outside.

10. A vacuum thermally bonding apparatus for thermally bonding an element onto a substrate under vacuum, said vacuum thermally bonding apparatus comprising:
 (a) a base,
 (b) a press cylinder lower plate arranged on the base,
 (c) a lower heater plate arranged adiabatically above the press cylinder lower plate,
 (d) a lower plate member arranged on an upper face of the lower heater plate, a substrate-placing member arranged on the lower plate member,
 (e) supporting posts erected on the base,
 (f) a press cylinder upper plate fixed to upper portions of the supporting posts,
 (g) an intermediate member arranged under the press cylinder upper plate,
 (h) an upper heater plate arranged adiabatically under the intermediate member,
 (i) an upper frame member arranged gas-tightly on a lower face of the upper heater plate, a lower end of the upper frame member being gas-tightly sealable on a peripheral portion of the lower plate member,
 (j) an inner frame body attached to a lower face of the upper heater plate within the upper frame member, a lower end face of the inner frame body being positioned above an upper face of the lower plate member, and the lower end face being brought into gas-tight contact with an upper face of the substrate-placing table when the inner frame body and the substrate-placing table are approached to and brought into contact with each other,
 (k) a driving unit that moves at least one of the lower plate member and the intermediate member relative to each other in an approaching direction, to form a vacuum partition wall defining a vacuum chamber by gas-tightly and slidably sealing the lower end of the upper frame member to the peripheral portion of the lower plate member, to bring the lower end face of the inner frame body into gas-tight contact with the upper face of the substrate-placing table by further moving at least one of the lower plate member and the intermediate member relative to each other in the approaching direction, and to move at least one of the lower plate member and the intermediate member relative to each other in a separating direction, and
 (l) a vacuuming or pressurizing opening for deaerating to vacuum or pressurizing the vacuum chamber inside the vacuum partition wall,
 (m) wherein the vacuum chamber is opened by moving at least one of the lower plate member and the intermediate member relative to each other in the separating direction with the driving unit,
 (n) an element-provided substrate in which an element is preliminarily bonded and fixed onto a substrate via an adhesive is placed on an upper face of the substrate-placing table; a sealing sheet to seal the element-provided substrate is placed on an upper face of the element and between the element and the pressurizing release film, while being extended outside the element; the pressurizing release film is placed on or above an upper face of the sealing sheet, while being extended above and outside the substrate and an outer peripheral portion of the pressurizing release film and a lower face of the inner frame body are opposed to each other outside the substrate;
 (o) by moving at least one of the lower plate member and the intermediate member relative to each other in the approaching direction with the driving unit, the lower end of the upper frame member is gas-tightly slidably sealed to the peripheral portion of the lower plate member and the vacuum partition wall to define the vacuum chamber therein is formed,
 (p) the pressurizing release film is contacted with the upper face of the sealing sheet on the upper face of the element, and softened under heating in the atmospheric pressure,
 (q) the vacuum chamber is evacuated to vacuum via the vacuuming or pressurizing opening,
 (r) the outer peripheral portion of the pressurizing release film is gas-tightly held between the upper face of the substrate-placing table and the lower face of the inner frame body by further moving at least one of the lower plate member and the intermediate member relative to each other in the approaching direction by means of the driving unit; and
 (s) by applying the atmospheric pressure or a pressure higher than the atmospheric pressure to a space above the pressurizing release film inside the vacuum chamber via the vacuuming or pressurizing opening in this state, the pressurizing release film and the sealing sheet are adhered to the substrate and the element, and the element is sealed and bonded to the substrate.

11. The vacuum thermally bonding apparatus set forth in claim 10, wherein a plurality of elements are placed on the upper face of the substrate.

12. The vacuum thermally bonding apparatus set forth in claim 10, wherein the pressurizing release film is detachably fixed to the lower end face of the inner frame member.

13. The vacuum thermally bonding apparatus set forth in claim 12, wherein a slide table is laterally movably arranged on the upper face of the base, the lower heater plate is arranged adiabatically on the slide table, the slide table-moving device is provided to move the slide table; in a state that the upper frame member is moved upwardly, the slide table, the lower heater plate and the lower plate member can be taken out by the slide table-moving device, the slide table, the lower heater plate and the lower plate member can be moved to under the upper frame member inside the vacuum thermally bonding apparatus by the slide table-moving device; the substrate is place on the substrate-placing table, and the element is placed on the substrate, or the element-provided substrate is placed on the substrate-plating table and the sealing sheet is placed on the element of the element-provided substrate, the slide table-moving device enables the slide table, the lower heater plate and the lower plate member to move to under the upper frame member within the vacuum thermally bonding apparatus and to take out the substrate and the element having undergone a bonding treatment or the element-provided substrate having undergone a sealing and bonding treatment with the sealing sheet.

14. The vacuum thermally bonding apparatus set forth in claim 10, wherein a pressurizing release film-holding jig is arranged around the substrate and on an upper face of the substrate-placing table, the outer periphery of the pressurizing release film is detachably fixed to the pressurizing release film-holding jig; in a state that the pressurizing release film-holding jig is arranged around the substrate, while a slight ventilatable gap is provided on the lower plate member via a spring, the pressurizing release film is arranged on or above the upper face of the element on the substrate, or on or above the sealing sheet on the upper face of the element; by moving at least one of the lower plate member and the intermediate member relative to each other with the driving unit in the approaching direction, the lower end portion of the upper frame member is gas-tightly slidably sealed to the peripheral portion of the lower plate member, thereby forming the vacuum partition wall to define the vacuum chamber; after the pressurizing release film is softened under heating in the atmosphere, the vacuum chamber is evacuated to vacuum through the vacuuming or pressurizing opening; by further moving at least one of the lower plate member and the intermediate member relative to each other with the driving unit in the approaching direction, the pressurizing release film-holding jig is slidably brought into gas-tight contact with the upper face of the lower plate member, thereby holding a space between the pressurizing release film and the upper face of the lower plate member in vacuum; and in this state the atmospheric pressure or a pressure higher than the atmospheric pressure is applied into a space above the pressurizing release film within the vacuum partition wall through the vacuuming or pressurizing opening, thereby the pressurizing release film is adhered onto the outer surfaces of the substrate and the element.

15. The vacuum thermally bonding apparatus set forth in claim 14, wherein a slide table is laterally movably arranged on the upper face of the base, the lower heater plate is arranged adiabatically on the slide table, a slide table-moving device is provided to move the slide table; in a state that the upper frame member is moved upwardly, the slide table, the lower heater plate and the lower plate member can be taken outside by the slide table-moving device, whereas the slide table, the lower heater plate and the lower plate member can be moved to under the upper frame member inside the vacuum thermally bonding apparatus by the slide table-moving device; the substrate is placed on the substrate-placing table, and the element is placed on the substrate, or the element-provided substrate is placed on the substrate-placing table, and the sealing sheet is placed on the element of the element-provided substrate, the pressurizing release film-holding jig is arranged on the upper face of the substrate-placing table and around the substrate; by the slide table-moving device, the slide table, the lower heater plate and the lower plate member can be moved to under the upper frame member inside the vacuum thermally bonding apparatus and the substrate and the element having undergone a bonding treatment or the element-provided substrate having undergone a sealing/bonding treatment with the sealing sheet can be taken out.

16. The vacuum thermally bonding apparatus set forth in claim 10, wherein the pressurizing release film is arranged on the upper face of the element or on the sealing sheet on the upper face of the element, while being arranged above the substrate and extended outwardly from the sealing sheet, and the outer periphery of the pressurizing release film is opposed to the lower face of the inner frame body.

17. The vacuum thermally bonding apparatus set forth in claim 10, wherein the intermediate plate is slidable relative to the supporting posts under the press cylinder upper plate, the upper heater plate is fixed adiabatically to the lower face of the intermediate plate, a moving cylinder is provided above the press cylinder upper plate as the driving unit, and the lower end of a cylinder rod of the moving cylinder is fixed to the intermediate plate through the press cylinder upper plate.

18. The vacuum thermally bonding apparatus set forth in claim 10, wherein a slide table is laterally movably arranged on the upper face of the base, the lower heater plate is arranged adiabatically on the slide table, a slide table-moving device is provided to move the slide table; in a state that the upper frame member is moved upwardly, the slide table, the lower heater plate and the lower plate member are taken outside by the slide table-moving device, whereas the slide table, the lower heater plate and the lower plate member are movable to under the upper frame member within the vacuum thermally bonding apparatus by the slide table-moving device; the substrate is placed on the substrate-placing table, the element is placed on the substrate, and the pressurizing release film is placed on the element, or alternatively, the element-provided substrate is placed on the substrate-placing table, the sealing sheet is placed on the element of the element-provided substrate, and the pressurizing release film is placed on the sealing sheet; the slide table, the lower heater plate and the lower plate member are movable to under the upper frame member inside the vacuum thermally bonding apparatus by the slide table-moving device; and the substrate and the element having undergone a bonding treatment and the pressurizing release film, or the element-provided substrate having undergone a sealing and bonding treatment with the sealing sheet can be taken outside.

* * * * *